United States Patent
Woo et al.

(10) Patent No.: US 9,755,179 B2
(45) Date of Patent: Sep. 5, 2017

(54) CONDUCTOR AND METHOD OF MANUFACTURING THE SAME

(71) Applicant: SAMSUNG ELECTRONICS CO., LTD., Suwon-si, Gyeonggi-do (KR)

(72) Inventors: Yun Sung Woo, Yongin-si (KR);
Jinyoung Hwang, Yongin-si (KR);
Weonho Shin, Seocho-gu (KR);
Hyangsook Lee, Hwaseong-si (KR);
Chan Kwak, Gyeonggi-do (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/003,845

(22) Filed: Jan. 22, 2016

(65) Prior Publication Data

US 2017/0040566 A1    Feb. 9, 2017

(30) Foreign Application Priority Data

Aug. 6, 2015    (KR) .......................... 10-2015-0111263

(51) Int. Cl.
*H01L 51/52*    (2006.01)
*H01L 51/00*    (2006.01)
(Continued)

(52) U.S. Cl.
CPC ........... *H01L 51/5225* (2013.01); *H01B 1/02* (2013.01); *H01B 3/18* (2013.01); *H01L 51/004* (2013.01);
(Continued)

(58) Field of Classification Search
CPC . H01L 51/5225; H01L 51/52; H01L 51/5234; H01L 51/004; H01L 51/0093;
(Continued)

(56) References Cited

U.S. PATENT DOCUMENTS

| 7,869,030 B2 * | 1/2011 | Zhong | .................... B82Y 15/00 356/301 |
| 8,094,247 B2 * | 1/2012 | Allemand | .............. B82Y 10/00 349/12 |

(Continued)

FOREIGN PATENT DOCUMENTS

| JP | 5112492 B2 | 1/2013 |
| JP | 5583097 B2 | 9/2014 |
| KR | 1020120092294 A | 8/2012 |

OTHER PUBLICATIONS

Jiming Bao et al., "Broadband ZnO Single-Nanowire Light-Emitting Diode", Nano Letters, vol. 6, No. 8, 2006, pp. 1719-1722.*

(Continued)

*Primary Examiner* — William Coleman
(74) *Attorney, Agent, or Firm* — Cantor Colburn LLP

(57) ABSTRACT

A conductor includes a plurality of metal nanostructures having a circular cross-sectional shape, where each of the metal nanostructures is surrounded by an organic material having a thickness of less than or equal to about 0.5 nm. A method of manufacturing a conductor includes preparing a metal nanostructure having a polygonal cross-sectional shape, and providing a metal nanostructure having a circular cross-sectional shape by supplying light to the metal nanostructure having a polygonal cross-sectional shape.

19 Claims, 10 Drawing Sheets

(51) Int. Cl.
*H01B 1/02* (2006.01)
*H01B 3/18* (2006.01)

(52) U.S. Cl.
CPC ...... *H01L 51/0093* (2013.01); *H01L 51/5209* (2013.01); *H01L 51/5234* (2013.01); *H01L 2251/301* (2013.01); *H01L 2251/558* (2013.01)

(58) Field of Classification Search
CPC . H01B 3/18; H01B 7/04; H01B 13/06; H01B 1/02
See application file for complete search history.

(56) References Cited

U.S. PATENT DOCUMENTS

| | | | | |
|---|---|---|---|---|
| 8,203,195 | B2 * | 6/2012 | Ivanov | H01L 31/032 257/436 |
| 8,623,253 | B2 * | 1/2014 | Jolley | B29C 73/02 264/234 |
| 8,709,372 | B2 * | 4/2014 | Zhu | D06M 15/333 264/103 |
| 8,815,159 | B2 * | 8/2014 | Bard | B82Y 15/00 422/82.08 |
| 8,946,678 | B2 * | 2/2015 | Bandyopadhyay | H01L 31/035227 257/21 |
| 9,372,283 | B2 * | 6/2016 | Nikoobakht | B82Y 20/00 |
| 2009/0196826 | A1 * | 8/2009 | Gao | A61K 9/5146 424/9.3 |
| 2013/0216779 | A1 * | 8/2013 | Hofmeister | B29C 41/38 428/141 |
| 2014/0104511 | A1 | 4/2014 | Liu et al. | |
| 2014/0186587 | A1 * | 7/2014 | Shin | H05K 1/09 428/172 |
| 2015/0056382 | A1 * | 2/2015 | Suganuma | H01B 1/22 427/553 |
| 2015/0290715 | A1 * | 10/2015 | Moody | H01B 1/22 420/501 |
| 2015/0316955 | A1 * | 11/2015 | Dodds | G06F 3/041 345/173 |
| 2016/0096967 | A1 * | 4/2016 | Virkar | G02B 1/14 428/215 |
| 2016/0108256 | A1 * | 4/2016 | Yang | C09D 5/24 428/220 |
| 2016/0293288 | A1 * | 10/2016 | Hu | H05K 3/1283 |
| 2016/0369104 | A1 * | 12/2016 | Gu | C09D 4/06 |

OTHER PUBLICATIONS

Jorg P. Kottmann, et al.; Plasmon Resonances of Silver Nanowires Wiht a Nonregular Cross Section; The American Physical Society, Physical Review B, vol. 64, 235402, pp. 1-10; 2001.
Search Report for Korean Application No. 10-2015-0111263, Filing Date Aug. 6, 2015; Report Mail Date Mar. 25, 2015; 9 pages.
Xiaoming Sun, et al.; Cylindrical Silver Nanowires: Preparation, Structure, and Optical Properties; Advanced Materials, 2005, 17, pp. 2626-2630.

* cited by examiner

CONDUCTOR AND METHOD OF MANUFACTURING THE SAME

CROSS-REFERENCE TO RELATED APPLICATION

This application claims priority to Korean Patent Application No. 10-2015-0111263, filed on Aug. 6, 2015, and all the benefits accruing therefrom under 35 U.S.C. §119, the content of which in its entirety is herein incorporated by reference.

BACKGROUND

1. Field

The disclosure relates to a conductor and a method of manufacturing the conductor.

2. Description of the Related Art

An electronic device such as a liquid crystal display ("LCD"), an organic light emitting diode ("OLED") device, and a touch screen panel typically includes a transparent conductor as a transparent electrode.

The transparent conductor may be broadly classified as one of three types according to the material thereof. For example, the three types include an organic-based transparent conductor such as a conductive polymer, an oxide-based transparent conductor such as indium tin oxide ("ITO"), and a metal-based transparent conductor such as a metal grid.

However, the conductive polymer has high specific resistance and low transparency and may be easily deteriorated when exposed to moisture and air. The indium tin oxide ("ITO") may increase the manufacturing cost due to the expensive indium, which is an essential element, and may deteriorate flexibility to limit being applied for a flexible device. The metal-based transparent conductor may increase the manufacturing cost due to the complicated manufacturing process.

Recently, as a flexible device draws increased attention, materials capable of being applied for a transparent electrode for a flexible device have been researched, and for example, the material may include a metal nanostructure such as silver nanowires. The metal nanostructure may be prepared in a form of, for example, as an ink composition and then coated on a substrate and dried to provide a conductive thin film.

However, the metal nanostructure may deteriorate optical properties of the conductor due to light scattering on the metal surface.

SUMMARY

One embodiment provides a conductor being capable of preventing degradation of optical properties due to a metal nanostructure.

Another embodiment provides a method of manufacturing the conductor.

Yet another embodiment provides an electronic device including the conductor.

According to an embodiment, a conductor includes a plurality of metal nanostructures having a circular cross-sectional shape, where each of the metal nanostructure is surrounded by an organic material having a thickness of less than or equal to about 0.5 nanometer (nm).

In an embodiment, the conductor may have a haze of less than about 0.65.

In an embodiment, the metal nanostructure may include silver, gold, copper, nickel, platinum, an alloy thereof, or a combination thereof.

In an embodiment, the organic material may include polyvinylpyrrolidone, polyvinyl alcohol, alkyl sodium sulfate, laurylamine, hydroxypropyl cellulose or a combination thereof.

In an embodiment, the conductor may have a light transmittance of greater than or equal to about 85% at about 550 nm, and a sheet resistance of less than or equal to about 60 ohms per square ($\Omega$/sq.).

In an embodiment, a light absorption spectrum of the metal nanostructure may have a single peak.

In an embodiment, the single peak of the light absorption spectrum of the metal nanostructure may be observed in a wavelength region of about 360 nm to about 400 nm.

According to another embodiment, a method of manufacturing a conductor includes preparing a metal nanostructure having a polygonal cross-sectional shape, and providing a metal nanostructure having a circular cross-sectional shape by supplying light to the metal nanostructure having the polygonal cross-sectional shape.

In an embodiment, the metal nanostructure may include silver, gold, copper, nickel, platinum, an alloy thereof, or a combination thereof.

In an embodiment, the light may include ultraviolet light, laser light or a combination thereof.

In an embodiment, the light may be the ultraviolet light, and the ultraviolet light may be irradiated in an intensity in a range of about 1 joule per square centimeter ($J/cm^2$) to about 50 $J/cm^2$.

In an embodiment, the manufacturing method may further include preparing a conductive film before or after the providing the metal nanostructure having the circular cross-sectional shape.

In an embodiment, the preparing the conductive film may be performed before the providing the metal nanostructure having the circular cross-sectional shape, and the preparing the conductive film may include preparing a conductive ink including the metal nanostructure having the polygonal cross-sectional shape and a solvent, applying the conductive ink on a substrate, and drying the conductive ink to provide the conductive film, where the metal nanostructure having a polygonal cross-sectional shape may be converted to the metal nanostructure having a circular cross-sectional shape by applying light to the conductive film.

In an embodiment, the preparing a conductive film may be performed after providing the metal nanostructure having the circular cross-sectional shape, and the preparing a conductive film may include preparing a conductive ink including the metal nanostructure having the circular cross-sectional shape and a solvent, applying the conductive ink on a substrate, and drying the conductive ink to provide the conductive film.

In an embodiment, the metal nanostructure having the polygonal cross-sectional shape may be surrounded by an organic material having a first thickness, and the metal nanostructure having the circular cross-sectional shape may be surrounded by an organic material having a second thickness thinner than the first thickness.

In an embodiment, the second thickness may be less than or equal to about 0.5 nm.

In an embodiment, the organic material may include polyvinylpyrrolidone, polyvinyl alcohol, alkyl sodium sulfate, laurylamine, hydroxypropyl cellulose or a combination thereof.

According to another embodiment, an electronic device includes the conductor described above.

In an embodiment, the electronic device may further include a liquid crystal display ("LCD"), an organic light emitting diode ("OLED") display, a touch screen panel, a solar cell, a photoelectronic device, or a sensor.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
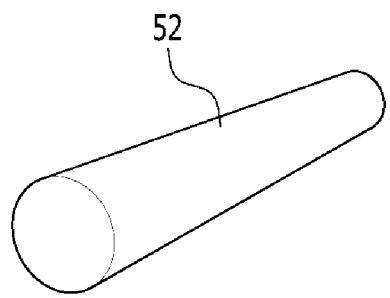
FIG. 1 is a schematic view of a metal nanostructure in a conductor according to one embodiment.

Exemplary embodiments will hereinafter be described in detail, and may be easily performed by those who have common knowledge in the related art. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an embodiment of a conductor according to the invention will be described.

In an embodiment, a conductor includes a plurality of metal nanostructures.

FIG. 1 is a schematic view of a metal nanostructure in a conductor according to one embodiment.

In an embodiment, the conductor may be, for example, a conductive thin film, but is not limited thereto.

The metal nanostructure 52 may be a nano-level structure including a metal and may include, for example, nanowires, nanotubes, nanocapsules, or a combination thereof, but is not limited thereto.

The metal nanostructure 52 may have a diameter of, for example, less than or equal to about 500 nanometers (nm). In one embodiment, for example, the metal nanostructure 52 may have a diameter in a range of about 5 nm to about 500 nm, or in a range of about 10 nm to about 300 nm.

The metal nanostructure 52 may include a low resistance metal, for example, silver, gold, copper, nickel, platinum, an alloy thereof, or a combination, e.g., an alloy, thereof. In one embodiment, for example, the metal nanostructure 52 may include a silver nanostructure. The metal nanostructure 52 may be synthesized by, for example, growing a metal seed together with an organic reagent under predetermined conditions. In one embodiment, for example, the metal nanostructure 52 may be synthesized according to a polyol method. In such an embodiment, an organic material may be coated on the surface of synthesized metal nanostructure 52.

In an embodiment, the metal nanostructure 52 may include a metal nanostructure coated with polyvinylpyrrolidone ("PVP"), polyvinyl alcohol ("PVA"), alkyl sodium sulfate, laurylamine, hydroxypropyl cellulose ("HPC"), or a combination thereof. In one embodiment, for example, the metal nanostructure 52 may be a silver nanostructure coated with PVP, PVA, alkyl sodium sulfate, laurylamine, HPC, or a combination thereof.

In an embodiment, the metal nanostructure 52 may include a metal nanostructure coated with PVP. In one embodiment, for example, the metal nanostructure 52 may be a silver nanostructure coated with PVP.

The conductor may include a plurality of metal nanostructures 52 randomly arranged, and the adjacent metal nanostructures 52 may contact each other such that the electrical properties of the conductor may be enhanced.

Figure 2:
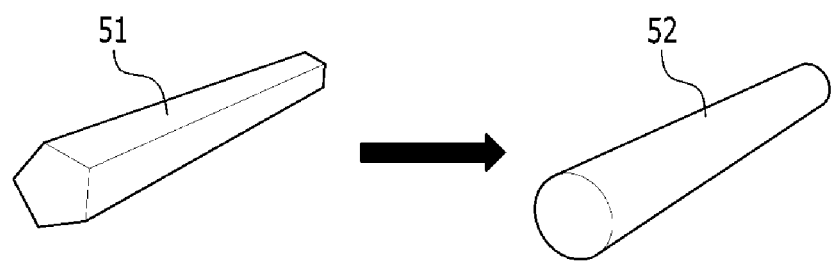
FIG. 2 is a schematic view showing a method of manufacturing a conductor according to one embodiment.

In an embodiment, as shown in FIG. 2, the polygonal edge parts of the metal nanostructure 52 may be substantially removed by light irradiation to provide a cylindrical shape having a substantially circular cross-sectional shape or surface. In one embodiment, for example, the metal nanostructure having a substantially circular cross-sectional shape may be obtained by irradiating light onto a metal nanostructure having a pentagonal cross-sectional shape.

In such an embodiment, where the metal nanostructure includes a cylindrical metal nanostructure 52 having a circular cross-sectional shape, surface plasmon due to the metal free electron generated in the polygonal edge part may be decreased to suppress light scattering. Accordingly, the increase of haze of the conductor, which may occur due to the light scattering, may be effectively prevented.

The metal nanostructure 52 having a circular cross-sectional shape may be observed in a single peak in the light absorption spectrum. This may contrast with the polygonal metal nanostructure that is observed in a plurality of peaks in the light absorption spectrum. Thereby, the surface plasmon distribution change on the surface of the metal nanostructure 52 having a circular cross-sectional shape may be observed or confirmed.

The light absorption spectrum of the metal nanostructure having a pentagonal cross-sectional shape may have a peak at a wavelength of less than about 360 nm and a peak in a wavelength region of about 360 nm to about 400 nm. In an embodiment, the light absorption spectrum of the metal nanostructure 52 may have a single peak in a wavelength region of about 360 nm to about 400 nm.

In such an embodiment, the conductor may have a reduced haze by suppressing the light scattering on the surface of the metal nanostructure 52 therein. In such an embodiment, the conductor may have a haze of less than about 0.65. In one embodiment, for example, the conductor may have a haze of less than or equal to about 0.60 or less than or equal to about 0.55.

In such an embodiment, during the surface treatment for removing the polygonal edge part of the metal nanostructure, an organic material surrounding the metal nanostructure 52 may be removed, such that the organic material surrounding the metal nanostructure 52 may have a thin thickness. In one embodiment, for example, the organic material surrounding the metal nanostructure 52 may have a thickness of less than or equal to about 0.5 nm.

In one embodiment, for example, the metal nanostructure 52 may be a nanostructure including silver, gold, copper, nickel, platinum, an alloy thereof, or a combination, e.g., an alloy, thereof, and the organic material may include PVP, PVA, alkyl sodium sulfate, laurylamine, HPC, or a combination thereof. In such an embodiment, the alkyl sodium sulfate may be, for example, dodecyl sodium sulfate.

The conductor may include a binder, and optionally a polymer dispersing agent in addition to the metal nanostructure 52.

In one embodiment, for example, the conductor may be a transparent conductor, and may have a haze of less than about 0.65, a light transmittance of greater than or equal to about 85%, and a sheet resistance of less than or equal to about 100 ohms per square ($\Omega$/sq.), simultaneously. In such an embodiment, the haze of the conductor may be, for example, in a range of about 0.30 to about 0.60, or, for example, of the conductor about 0.30 to about 0.55. In such an embodiment, the light transmittance of the conductor may be, for example, in a range of about 85% to about 100%, or for example, in a range of about 88% to about 100%. In such an embodiment, the sheet resistance of the conductor may be in a range of about 20 $\Omega$/sq. to about 100 $\Omega$/sq., or for example, in a range of about 30 $\Omega$/sq. to about 90 $\Omega$/sq. In such an embodiment, the conductor may be a transparent electrode simultaneously satisfying the above-ranged haze, light transmittance and sheet resistance.

Hereinafter, an embodiment of the method of manufacturing a conductor will be described with reference to FIG. 2.

FIG. 2 is a schematic view showing a method of manufacturing a conductor according to one embodiment.

An embodiment of the method of manufacturing a conductor includes preparing a metal nanostructure 51 having a polygonal cross-sectional shape, and performing a surface treatment on the metal nanostructure 51 having a polygonal cross-sectional shape to provide a metal nanostructure 52 having a circular cross-sectional shape.

The metal nanostructure 51 having a polygonal cross-sectional shape may be synthesized by, for example, growing a metal seed together with an organic reagent under predetermined conditions. In one embodiment, for example, the metal nanostructure 51 having a polygonal cross-sectional shape may be obtained according to a polyol method using PVP.

The surface treatment may be performed directly on the metal nanostructure 51 having a polygonal cross-sectional shape, or the metal nanostructure 51 having a polygonal cross-sectional shape may be formed into a conductive thin film and then the surface treatment may be performed to the conductive thin film.

In one embodiment, for example, the surface treatment may be performed directly to the metal nanostructure 51 having a polygonal cross-sectional shape. In such an embodiment, the surface treatment may be performed by irradiating light on the metal nanostructure 51 having a polygonal cross-sectional shape. The light may be, for example, ultraviolet light, laser light, or a combination thereof, but is not limited thereto. The wavelength region of ultraviolet light or laser light may be determined according to the light-absorption wavelength of the metal nanostructure 51. The irradiation intensity of ultraviolet light or laser light may be controlled depending upon a kind or a size of the metal nanostructure 51, and the like. In one embodiment, for example, irradiation intensity of ultraviolet light or laser may be in a range of about 1 joule per square centimeter (J/cm$^2$) to about 200 J/cm$^2$ or in a range of about 1 J/cm$^2$ to about 50 J/cm$^2$.

When the edge part of the metal nanostructure 51 having a polygonal cross-sectional shape is removed by the surface treatment, a metal nanostructure 52 having a substantially circular cross-sectional shape may be obtained.

The metal nanostructure 52 having a circular cross-sectional shape may be formed into a conductive ink.

The conductive ink may include a metal nanostructure 52 having a circular cross-sectional shape, a binder and a solvent.

The metal nanostructure 52 may be included at about 0.01 wt % to about 10 wt % based on the total amount of the conductive ink.

The binder is not particularly limited as long as a material thereof appropriately controls viscosity of the conductive ink or may enhance adherence of the metal nanostructure 52 on a substrate. The binder may be, for example, an organic binder, for example methyl cellulose, ethyl cellulose, hydroxypropyl methyl cellulose ("HPMC"), HPC, xanthan gum, PVA, PVP, carboxylmethyl cellulose, hydroxyethyl cellulose, or a combination thereof, but is not limited thereto.

The binder may be included at about 5 parts by weight to about 50 parts by weight based on 100 parts by weight of the metal nanostructure 52.

The conductive ink may further include a polymer dispersing agent. The polymer dispersing agent may include, for example, a (meth)acrylate compound. The polymer dispersing agent may be included at about 0.1 parts by weight to about 5 parts by weight based on 100 parts by weight of the metal nanostructure.

The solvent may include a medium capable of dissolving and/or dispersing the metal nanostructure 52 and the binder. In an embodiment, the solvent may include, for example, water. In one embodiment, for example, the solvent may be a mixture of water and an alcohol, where the alcohol may be, for example, methanol, ethanol, n-propyl alcohol, isopropyl alcohol, n-butanol, isobutanol, t-butanol, propylene glycol, propylene glycol methyl ether, ethylene glycol or a combination thereof. The solvent may be included as the remaining amount except the above components and other solids.

The conductive ink may be applied on a substrate and dried to provide a conductive thin film.

The substrate may be a glass substrate, a semiconductor substrate, a polymer substrate. The substrate may further include an insulation layer, a semiconductor layer or a conductive layer, which is laminated on a glass substrate, a semiconductor substrate or a polymer substrate.

The conductive ink may be applied on the substrate using various methods, for example spin coating, bar coating, blade coating, slot die coating, inkjet coating, or a combination thereof.

The drying may be performed by natural drying, hot air drying, or heat treatment at a temperature of greater than or equal to the boiling point of the solvent.

In one embodiment, for example, the metal nanostructure 51 having a polygonal cross-sectional shape is formed into a conductive thin film, and then the surface treatment may be performed on the conductive thin film.

In such an embodiment, a conductive ink including the metal nanostructure 51 having a polygonal cross-sectional shape may be prepared. The conductive ink may include a metal nanostructure 51 having a polygonal cross-sectional shape, a binder and a solvent, and the conductive ink may selectively include a polymer dispersing agent.

In such an embodiment, the conductive ink is applied on a substrate and dried to provide a conductive thin film.

Subsequently, the conductive thin film undergoes a surface treatment, such that the surface of the conductive thin film is treated. The surface treatment may be performed by irradiating light. The light may be, for example, ultraviolet light, laser light or a combination thereof, but is not limited thereto. The wavelength region of ultraviolet light or laser light may be determined according to the light-absorption wavelength of the metal nanostructure 51. The irradiation intensity of the ultraviolet light or the laser light may be controlled depending upon the kind or the size of the metal nanostructure 51 or the like. In one embodiment, for example, the irradiation intensity of the ultraviolet light or the laser light may be in a range of about 1 $J/cm^2$ to about 200 $J/cm^2$, or in a range of about 1 $J/cm^2$ to about 50 $J/cm^2$.

The edge part of the metal nanostructure having a polygonal cross-sectional shape 51, which is dispersed in the conductive thin film, is removed by the surface treatment to provide a conductive thin film including the metal nanostructure 52 having a circular cross-sectional shape.

In such an embodiment, at least a portion of the organic material surrounding the surface of the metal nanostructure 52 by the surface treatment may be removed such that the metal nanostructure 52 having a circular cross-sectional shape may be surrounded by an organic material having a thinner thickness than the metal nanostructure 51 having a polygonal cross-sectional shape. In one embodiment, for example, the metal nanostructure 52 having a circular cross-sectional shape may be surrounded by an organic material having a thin thickness of less than or equal to about 0.5 nm.

The conductor may be applied to a transparent electrode for various electronic devices, for example, a flat panel display such as a liquid crystal display ("LCD"), an organic light emitting diode ("OLED") device, a touch screen panel, a solar cell, an e-window, a heat mirror, or a transparent transistor, but is not limited thereto. In such an embodiment, the conductor including a metal nanostructure has a high flexibility, such that the conductor may be effectively applied to a flexible electronic device.

Hereinafter, an embodiment where the electronic device, in which the conductor is applied to a transparent electrode, is an OLED device will be described with reference to FIG. 3.

Figure 3:
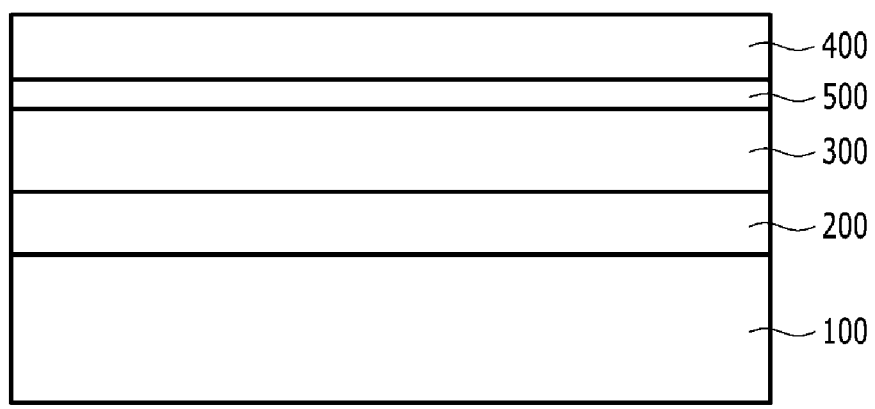
FIG. 3 is a schematic cross-sectional view showing an organic light emitting diode device according to one embodiment.

FIG. 3 is a schematic cross-sectional view showing an OLED device according to one embodiment.

Referring to FIG. 3, an embodiment of the OLED device includes a substrate 100, a lower electrode 200, an upper electrode 400 facing the lower electrode 200 and an emission layer 300 interposed between the lower electrode 200 and the upper electrode 400.

The substrate 100 may be, for example, a glass substrate, a polymer substrate, or a silicon substrate. The polymer substrate may include, for example polycarbonate, polymethylmethacrylate, polyethylene terephthalate, polyethylene naphthalate, polyamide, polyethersulfone, or a combination thereof, and the polymer substrate may be flexible. Herein, when a substrate or a film is flexible, the substrate or the film may each independently have a Young's modulus (i.e., a tensile modulus) of about 0.01 to 300 gigaPascals (GPa), e.g., about 0.001 to about 1 GPa, or about 0.05 to about 0.5 GPa.

In such an embodiment, one of the lower electrode 200 and the upper electrode 400 is a cathode, and the other of the lower electrode 200 and the upper electrode 400 is an anode. In one embodiment, for example, the lower electrode 200 may be an anode, and the upper electrode 400 may be a cathode.

At least one of the lower electrode 200 and the upper electrode 400 is transparent. In an embodiment, where the lower electrode 100 is transparent, an OLED device may be a bottom emission type in which light is emitted toward the substrate 100. In an embodiment, where the upper electrode 400 is transparent, the OLED device may be a top emission type in which light is emitted in the opposite direction of the substrate 100. In an alternative embodiment, where the lower electrode 200 and upper electrode 400 are both transparent, light may be emitted both toward the substrate 100 and in the opposite direction of the substrate 100.

The transparent electrode includes or is made of the conductor including the metal nanostructure, which is the same as an embodiment of the conductor described above.

The emission layer 300 may include or be made of an organic material that emits light of a color among primary colors such as red, green, blue, and the like, or a mixture of an inorganic material with the organic material, for example, a polyfluorene derivative, a (poly)paraphenylene vinylene derivative, a polyphenylene derivative, a polyfluorene derivative, polyvinylcarbazole, a polythiophene derivative, or a compound prepared by doping such polymer materials with a perylene-based pigment, a coumarin-based pigment, a rothermine-based pigment, rubrene, perylene, 9,10-diphenylanthracene, tetraphenyl butadiene, Nile red, coumarin, quinacridone, and the like. An OLED device displays a desirable image by a spatial combination of primary colors emitted by an emission layer therein.

The emission layer 300 may emit white light by combining three primary colors such as red, green, and blue. In an embodiment, the emission layer 30 may emit white light by combining colors of neighboring sub-pixels or by combining colors laminated in a vertical direction.

An auxiliary layer 500 may be disposed between the emission layer 300 and the upper electrode 400 to improve luminous efficiency. In an embodiment, as shown in FIG. 3, the auxiliary layer 500 is disposed only between the emission layer 300 and the upper electrode 400, but it is not limited thereto. In an alternative embodiment, the auxiliary layer 500 may be disposed between and emission layer 300 and the lower electrode 200, or between the emission layer 300 and the upper electrode 400 and between the emission layer 300 and the lower electrode 200.

The auxiliary layer 500 may include an electron transport layer ("ETL") and a hole transport layer ("HTL") for balancing between electrons and holes, an electron injection layer ("EIL"), a hole injection layer ("HIL") for reinforcing injection of electrons and holes, or the like. The auxiliary layer 500 may include one or more layers described above. Alternatively, the auxiliary layer 500 may be omitted.

As described above, an embodiment of the conductor may be applied to an OLED device, but is not limited thereto. An embodiment of the conductor may be used for an electrode for all electronic devices including transparent electrodes. In one embodiment, for example, the conductor may be used for a pixel electrode and/or a common electrode of a LCD, a display electrode of a plasma display device, a transparent electrode of a touch panel device, a transparent electrode of a solar cell, a transparent electrode of a photoelectronic device, a transparent electrode of a sensor, and the like.

Hereinafter, the embodiments of the invention will be described in more detail with reference to examples. These examples, however, are not in any sense to be interpreted as limiting the scope of this disclosure.

Preparation of Conductive Ink

Preparation Example 1

A conductive ink including 3 g of an aqueous solution including silver nanowires (Ag nanowires) coated with 1.3 wt % of PVP, 0.38 g of an aqueous solution of 0.25 wt % HPMC (H7509, manufactured by Sigma), water and isopropyl alcohol is prepared. The water and the isopropyl alcohol are included in the conductive ink at a weight ratio of about 66.9:33.1.

Preparation of Conductive Thin Film

Example 1

The conductive ink prepared according to Preparation Example 1 is coated on a polycarbonate substrate using a bar coater at a speed of 30 mm/s in an area of 5 mm×5 mm, and dried by hot air at 85° C. for 2 minutes to provide a conductive thin film. Subsequently, the conductive thin film is measured for initial sheet resistance and initial transparency.

Subsequently, the conductive thin film is irradiated by ultraviolet light using a ultraviolet curing device (Raynics) at an intensity of about 4.5 J/cm$^2$, and a surface treatment is performed to silver nanowires in the conductive thin film to provide a surface-treated conductive thin film.

Example 2

A surface-treated conductive thin film is prepared in accordance with the same procedure as in Example 1, except that the surface treatment is performed by irradiating ultraviolet light at an intensity of about 9.9 J/cm$^2$.

Example 3

A surface-treated conductive thin film is prepared in accordance with the same procedure as in Example 1, except that the surface treatment is performed by irradiating ultraviolet light at an intensity of about 19.7 J/cm$^2$.

Example 4

A surface-treated conductive thin film is prepared in accordance with the same procedure as in Example 1, except that the surface treatment is performed by irradiating ultraviolet light at an intensity of about 22.4 J/cm$^2$.

Comparative Example 1

A conductive thin film is prepared in accordance with the same procedure as in Example 1, except that the conductive thin film does not undergo the surface treatment.

Evaluation

Evaluation 1

The cross-sectional shapes of silver nanowires included in the conductive thin films according to Example 1 and Comparative Example 1 are observed.

Figure 4:
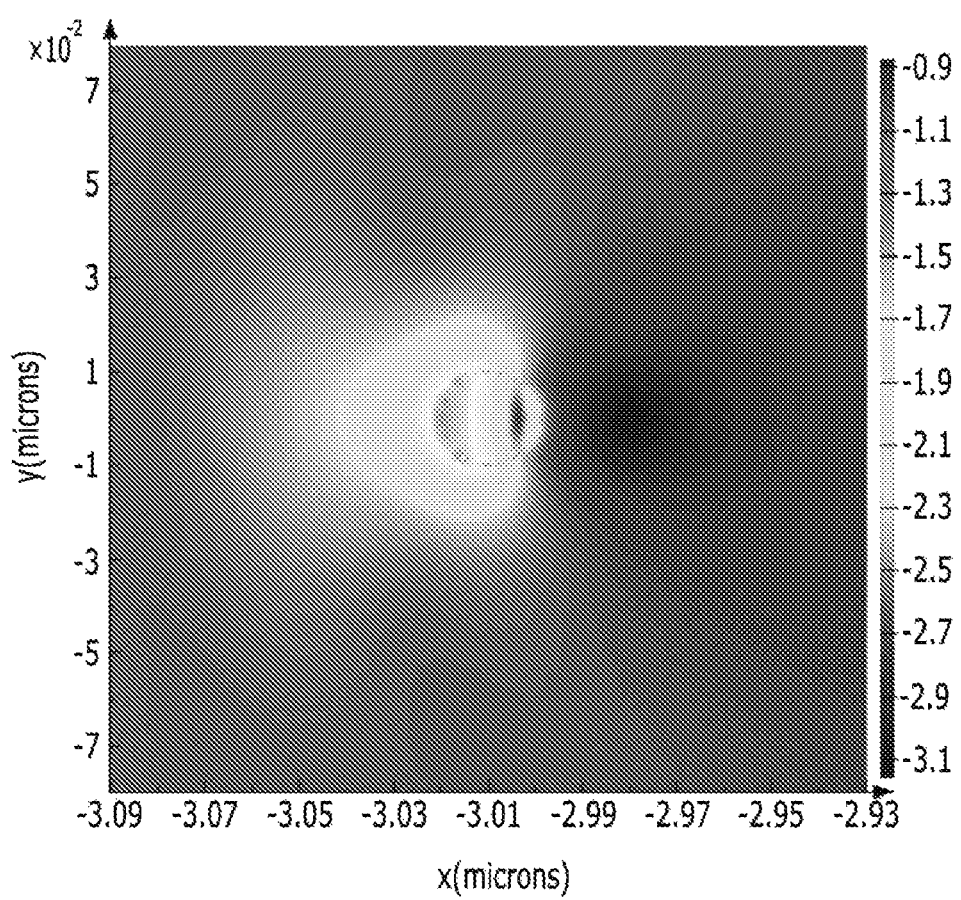
FIG. 4 is a photograph showing light scattering by silver nanowires included in a conductive thin film according to Example 1.
Figure 5:
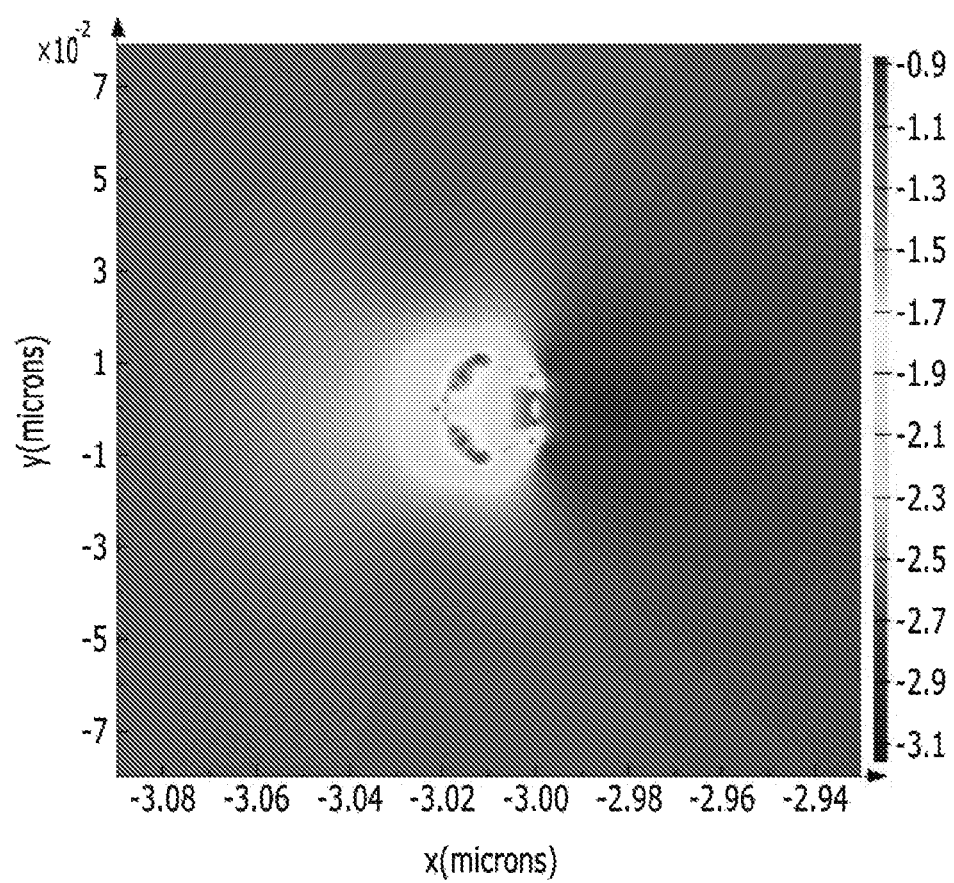
FIG. 5 is a photograph showing light scattering by silver nanowires included in the conductive thin film according to Comparative Example 1.

FIG. 4 is a photograph showing light scattering caused by silver nanowires included in the conductive thin film according to Example 1, and FIG. 5 is a photograph showing light scattering caused by silver nanowires included in the conductive thin film according to Comparative Example 1.

As shown in FIG. 4 and FIG. 5, the silver nanowires included in the conductive thin film according to Example 1 form electromagnetic waves having uniform intensity along with the circular cross-sectional shape, while the silver nanowires included in the conductive thin film according to Comparative Example 1 form irregular electromagnetic waves along the pentagonal cross-sectional shape.

Accordingly, it is confirmed the conductive thin film according to Example 1 include cylindrical silver nanowires by the ultraviolet light surface treatment.

Evaluation 2

The conductive thin films according to Examples 1 to 4 and Comparative Example 1 are observed for a light absorption spectrum.

Figure 6:
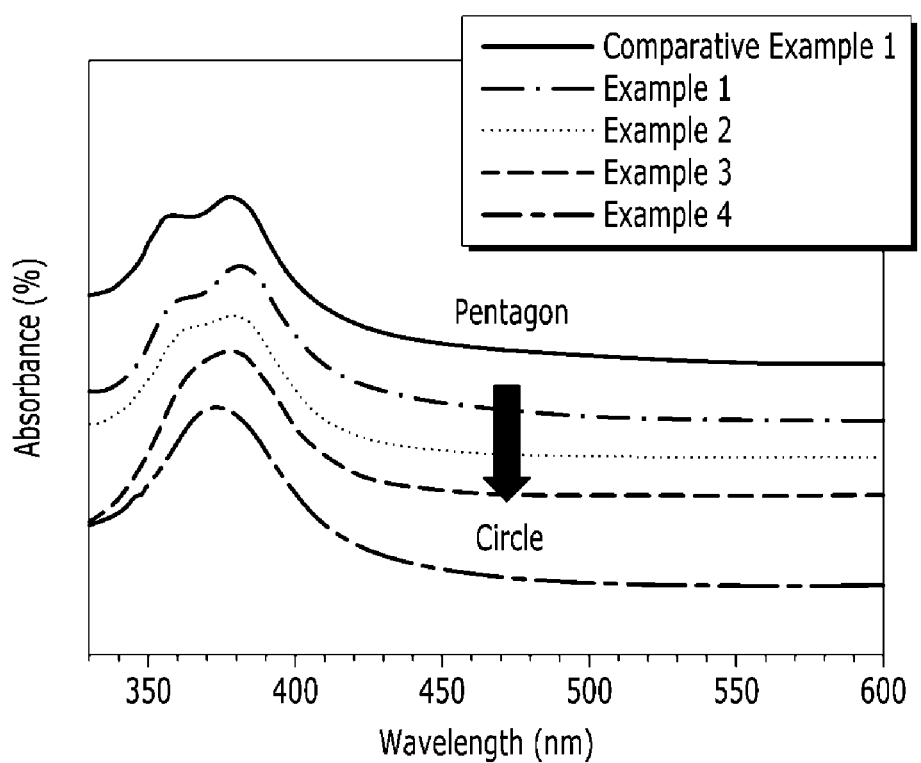
FIG. 6 is a light absorption spectrum of conductive thin films according to Examples 1 to 4 and Comparative Example 1.

FIG. 6 shows a light absorption spectrum of the conductive thin films according to Examples 1 to 4 and Comparative Example 1.

As shown in FIG. 6, each of the light absorption spectrums of the conductive thin films according to Examples 3 and 4 has a single peak in a wavelength region of about 360 nm to about 400 nm, while the light absorption spectrum of the conductive thin film according to Comparative Example 1 has a plurality of peaks in each wavelength of 356 nm and 372 nm. Accordingly, the surface plasmon distribution may be changed by the surface treatment as shown in FIG. 6.

Evaluation 3

The conductive thin films according to Examples 1 to 4 and Comparative Example 1 are measured for haze.

Haze is measured using NDH7000SP (NDK) 9 times and averaged.

Figure 7:
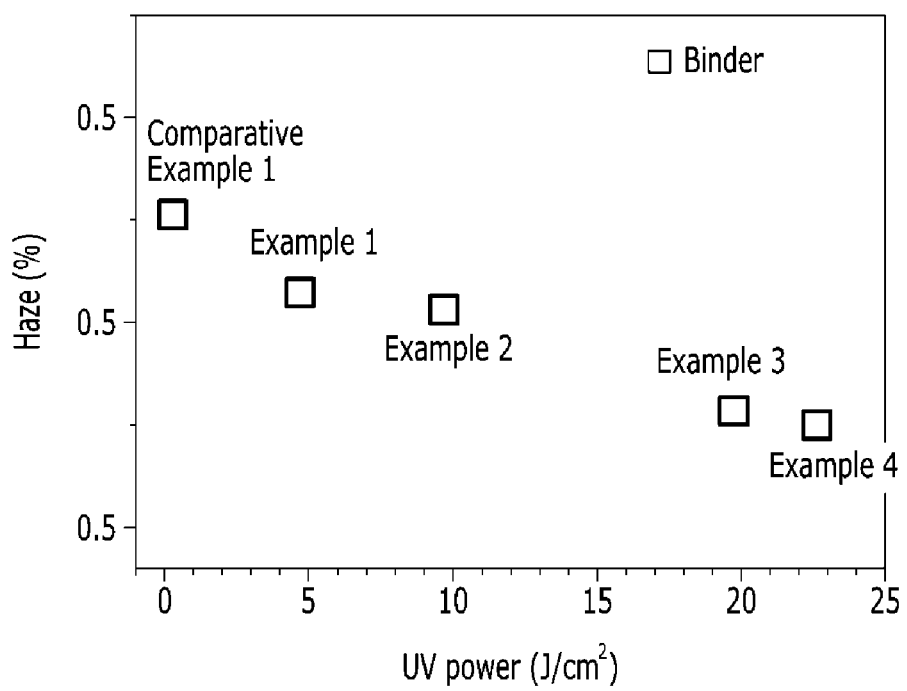
FIG. 7 is a graph showing haze of conductive thin films according to Examples 1 to 4 and Comparative Example 1.

FIG. 7 is a graph showing haze of the conductive thin films according to Examples 1 to 4 and Comparative Example 1.

As shown in FIG. 7, the conductive thin film according to Comparative Example 1, in which ultraviolet light is not irradiated, has haze of about 0.65, while the conductive thin films according to Examples 1 to 4 have haze of less than about 0.65. As shown in FIG. 7, haze of the conductive thin film may be further decreased as the ultraviolet light intensity is stronger on the surface treatment.

Evaluation 4

The conductive thin films according to Examples 1 to 4 and Comparative Example 1 are measured for light transmittance.

The light transmittance is measured 9 times using NDH7000SP (NDK) and then averaged.

Figure 8:
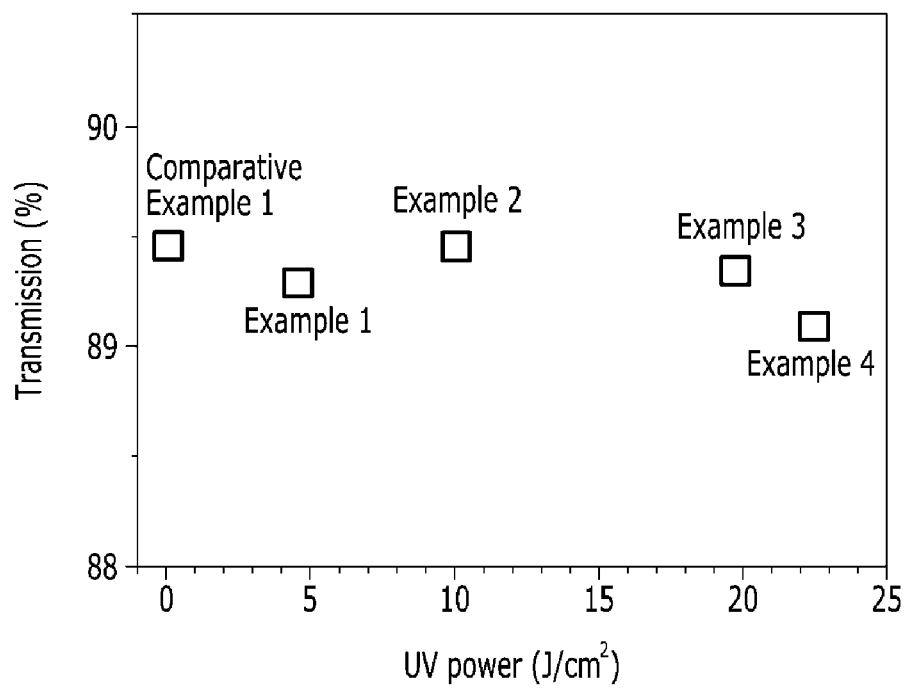
FIG. 8 is a graph showing light transmittance of conductive thin films according to Examples 1 to 4 and Comparative Example 1.

FIG. 8 is a graph showing light transmittance of the conductive thin films according to Examples 1 to 4 and Comparative Example 1.

As shown in FIG. 8, the conductive thin films according to Examples 1 to 4 and Comparative Example 1 have substantially the same light transmittance as each other. Accordingly, it is confirmed that the light transmittance is not deteriorated by the surface treatment of the conductive thin film.

Evaluation 5

The conductive thin films according to Examples 1 to 4 and Comparative Example 1 are evaluated for electrical characteristics.

The electrical characteristics are evaluated by sheet resistance, and the sheet resistance is measured 18 times using 4-point measurer (RCHCK, EDTM) and then averaged.

Figure 9:
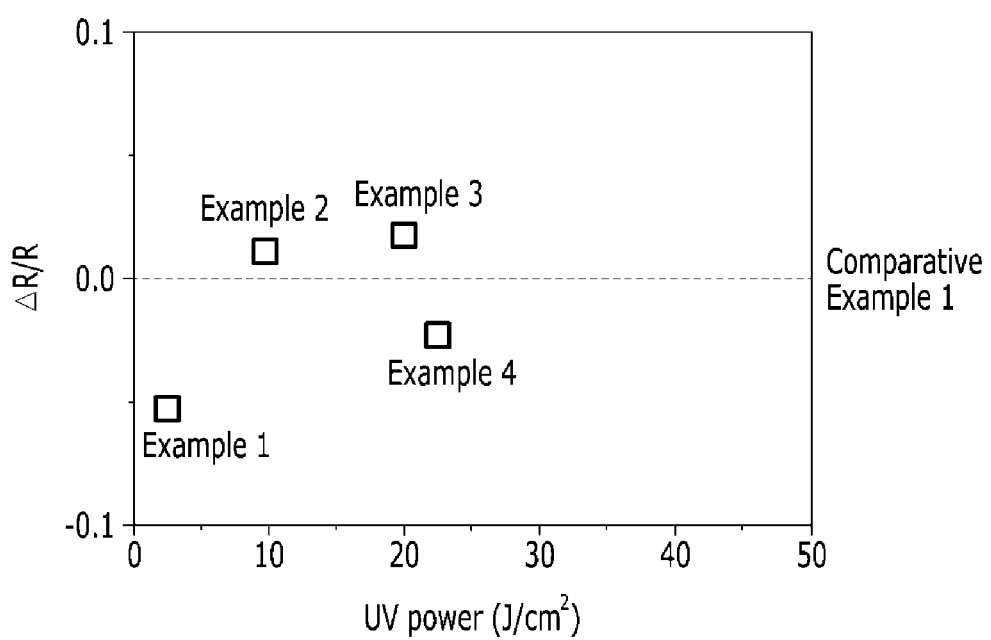
FIG. 9 is a graph showing sheet resistance of conductive thin films according to Examples 1 to 4 and Comparative Example 1.

FIG. 9 is a graph showing sheet resistance of the conductive thin films according to Examples 1 to 4 and Comparative Example 1.

As shown in FIG. 9, the conductive thin films according to Examples 1 to 4 have substantially equivalent sheet resistance to that of Comparative Example 1, and the conductive thin films according to Examples 1 to 4 have the sheet resistance change within about 5% compared to the conductive thin film according to Comparative Example 1. Accordingly, it is confirmed that the electrical characteristics are not deteriorated by the surface treatment of the conductive thin film.

Evaluation 6

The silver nanowires of conductive thin films according to Example 3 and Comparative Example 1 are observed using a transmission electron microscope ("TEM").

Figure 10:
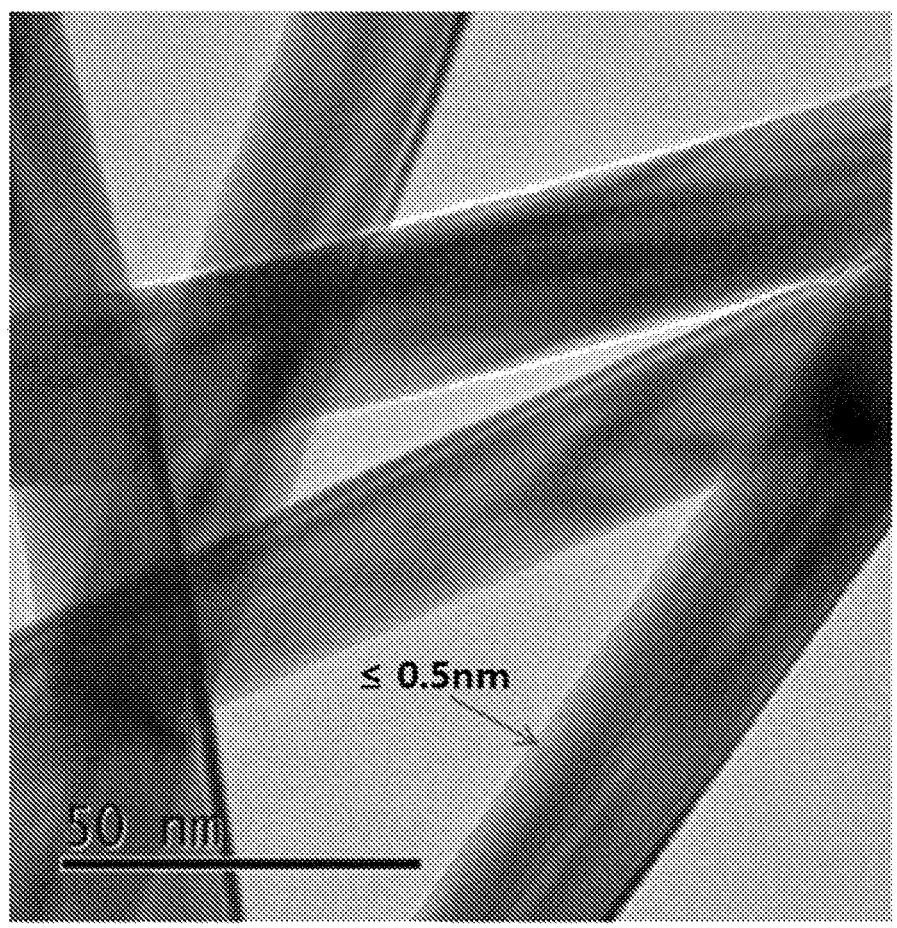
FIG. 10 is a TEM photograph showing silver nanowires of the conductive thin film according to Example 3.
Figure 11:
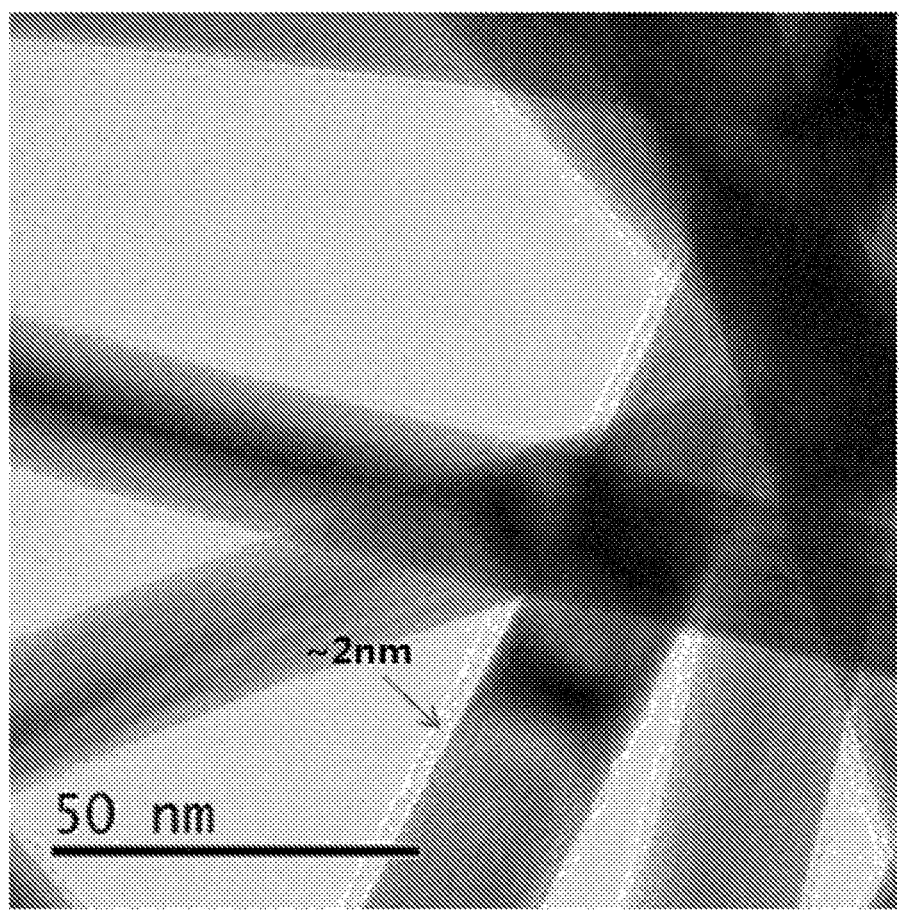
FIG. 11 is a TEM photograph showing silver nanowires of the conductive thin film according to Comparative Example 1.

FIG. 10 is a TEM photograph showing silver nanowires of the conductive thin film according to Example 3, and FIG. 11 is a TEM photograph showing silver nanowires of the conductive thin film according to Comparative Example 1.

As shown in FIG. 10 and FIG. 11, the silver nanowires of the conductive thin film according to Example 3 are covered with a relatively thin organic material having a thickness of less than or equal to about 0.5 nm, while the silver nanowires of the conductive thin film according to Comparative Example 1 are covered with an organic material having a thickness of about 2 nm. Accordingly, it is confirmed that the organic material covering the silver nanowires may be removed by performing the surface treatment to the conductive thin film.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductor comprising a plurality of metal nanostructures having a circular cross-sectional shape,
wherein each of the metal nanostructure is surrounded by an organic material having a thickness of less than or equal to about 0.5 nm.

2. The conductor of claim 1, wherein the conductor has a haze of less than about 0.65.

3. The conductor of claim 1, wherein the metal nanostructure comprises silver, gold, copper, nickel, platinum, an alloy thereof, or a combination thereof.

4. The conductor of claim 1, wherein the organic material comprises polyvinylpyrrolidone, polyvinyl alcohol, alkyl sodium sulfate, laurylamine, hydroxypropyl cellulose or a combination thereof.

5. The conductor of claim 1, wherein the conductor has a light transmittance of greater than or equal to about 85% at about 550 nm and a sheet resistance of less than or equal to about 60 Ω/sq.

6. The conductor of claim 1, wherein a light absorption spectrum of the metal nanostructure has a single peak.

7. An electronic device comprising the conductor of claim 1.

8. The conductor of claim 6, wherein the single peak of light absorption spectrum is in a wavelength region of about 360 nm to about 400 nm.

9. The electronic device of claim 7, wherein the electronic device comprises a liquid crystal display, an organic light emitting diode display, a touch screen panel, a solar cell, a photoelectronic device or a sensor.

10. A method of manufacturing a conductor, the method comprising:
preparing a metal nanostructure having a polygonal cross-sectional shape; and
removing a polygonal edge part of the metal nanostructure by supplying light to provide a metal nanostructure having a circular cross-sectional shape.

11. The method of claim 10, wherein the metal nanostructure comprises silver, gold, copper, nickel, platinum, an alloy thereof, or a combination thereof.

12. The method of claim 10, wherein the light comprises ultraviolet light, laser light or a combination thereof.

13. The method of claim 10, further comprising:
preparing a conductive film before or after the providing the metal nanostructure having the circular cross-sectional shape.

14. The method of claim 10, wherein
the metal nanostructure having the polygonal cross-sectional shape is surrounded by an organic material having a first thickness, and
the metal nanostructure having the circular cross-sectional shape is surrounded with the organic material having a second thickness thinner than the first thickness.

15. The method of claim 12, wherein
the light is the ultraviolet light, and
the ultraviolet light is irradiated in an intensity in a range of about 1 J/cm2 to about 50 J/cm2.

16. The method of claim 13, wherein
the preparing the conductive film is performed before the providing the metal nanostructure having a circular cross-sectional shape,
wherein the preparing the conductive film comprises:
preparing a conductive ink comprising the metal nanostructure having the polygonal cross-sectional shape and a solvent;
applying the conductive ink on a substrate; and
drying the conductive ink to provide the conductive film,
wherein the metal nanostructure having the polygonal cross-sectional shape is converted to the metal nanostructure having the circular cross-sectional shape by supplying the light to the conductive film.

17. The method of claim 13, wherein
the providing the conductive film is performed after the preparing the metal nanostructure having the circular cross-sectional shape,
wherein the providing the conductive film comprises:
preparing a conductive ink comprising the metal nanostructure having the circular cross-sectional shape and a solvent;
applying the conductive ink on a substrate; and
drying the conductive ink to provide the conductive film.

18. The method of claim 14, wherein the second thickness is less than or equal to about 0.5 nm.

19. The method of claim 14, wherein the organic material comprises polyvinylpyrrolidone, polyvinyl alcohol, alkyl sodium sulfate, laurylamine, hydroxypropyl cellulose or a combination thereof.

* * * * *